(12) United States Patent
Jahana

(10) Patent No.: US 8,179,200 B2
(45) Date of Patent: May 15, 2012

(54) AMPLIFIER CIRCUIT AND LIGHT RECEIVING AMPLIFIER CIRCUIT USING THE SAME

(75) Inventor: Tadashi Jahana, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 57 days.

(21) Appl. No.: 12/813,997

(22) Filed: Jun. 11, 2010

(65) Prior Publication Data
US 2011/0032031 A1    Feb. 10, 2011

(30) Foreign Application Priority Data
Aug. 6, 2009  (JP) .................................. 2009-183094

(51) Int. Cl.
*H03F 3/08* (2006.01)

(52) U.S. Cl. ........................ 330/308; 330/109; 330/86

(58) Field of Classification Search .................. 330/308, 330/109, 86
See application file for complete search history.

(56) References Cited

U.S. PATENT DOCUMENTS

| 6,028,469 | A  | * | 2/2000  | Roither et al. ................. 327/362 |
| 6,531,684 | B2 | * | 3/2003  | Rice et al. ................. 219/130.21 |
| 6,954,921 | B2 | * | 10/2005 | Hassibi et al. ................. 716/103 |
| 7,265,332 | B2 | * | 9/2007  | Baxter et al. ............. 250/214 DC |
| 7,372,319 | B1 | * | 5/2008  | Lee ................. 327/536 |
| 7,498,875 | B2 | * | 3/2009  | Forbes et al. ...................... 330/9 |
| 7,859,131 | B2 | * | 12/2010 | Xu et al. ......................... 307/11 |

FOREIGN PATENT DOCUMENTS

JP         6-338732          12/1994

* cited by examiner

*Primary Examiner* — Patricia Nguyen
(74) *Attorney, Agent, or Firm* — Young & Thompson

(57) ABSTRACT

An amplifier circuit includes an amplifier unit that amplifies a signal received by an input terminal and outputs the amplified signal to an output terminal, a feedback capacitor that is connected between the input terminal of the amplifier and the output terminal, and a controller that varies a capacitance in the feedback capacitor for a certain period when a potential of the output terminal in the amplifier unit becomes higher or lower than a certain potential.

12 Claims, 10 Drawing Sheets

AMPLIFIER CIRCUIT AND LIGHT RECEIVING AMPLIFIER CIRCUIT USING THE SAME

This application is based upon and claims the benefit of priority from Japanese patent application No. 2009-183094, filed on Aug. 6, 2009, the disclosure of which is incorporated herein in its entirety by reference.

BACKGROUND

1. Field of the Invention

The present invention relates to an amplifier circuit and a light receiving amplifier circuit using the same.

2. Description of Related Art

The recording speed of optical disc apparatus including CDs, DVDs, and Blue-Ray Discs has been increasing. This shortens the cycle of recording pulse waveforms for writing data into the optical discs. The optical power when the recording pulse is generated needs to be obtained accurately from low power to high power. There is also a need to accurately detect rising and falling of pulses without occurrence of ringing. Hence, amplifier circuits used in ICs (integrated circuits) receiving recording pulse waveforms are required to generate pulse response without ringing while keeping the wide-band frequency characteristics.

One example of an amplifier circuit used in a light receiving IC includes a technique disclosed in Japanese Unexamined Patent Application Publication No. 6-338732. FIG. 9 shows a feedback amplifier circuit 1 disclosed in Japanese Unexamined Patent Application Publication No. 6-338732. As shown in FIG. 9, the feedback amplifier circuit 1 includes a differential amplifier AMP1 and a feedback circuit 10.

The differential amplifier AMP1 amplifies a signal input from an input terminal IN received by an inverting input terminal and outputs the amplified signal to an output terminal OUT. Note that symbols "IN" and "OUT" are used to mean both the terminal names and the signal names input/output to/from the terminals.

The feedback circuit 10 includes feedback resistors R1, R2, R3, feedback capacitors C1, C2, and an NPN transistor Q1. The feedback circuit 10 feeds-back an output of the differential amplifier AMP1 to the inverting input terminal so that the differential amplifier AMP1 exhibits a certain amplification ratio. The differential amplifier AMP1 is an ideal differential amplifier; it operates with high input impedance, low output impedance, and high open loop gain, and has sufficient frequency band regarding the frequency characteristics.

The feedback resistors R1 and R2 are connected in series between the input terminal IN and the output terminal OUT. The feedback capacitor C1 is connected between the input terminal IN and the output terminal OUT. The feedback resistor R3 is connected between the input terminal IN and a node N1. The feedback capacitor C2 is connected between the input terminal IN and the node N1.

The NPN transistor Q1 has a base connected to an intermediate node between the feedback resistors R1 and R2, a collector connected to a power supply voltage terminal VDD, and an emitter connected to the node N1.

FIG. 10 shows operational waveforms of the feedback amplifier circuit 1. As shown in FIG. 10, the direct current component of the input signal of the feedback amplifier circuit 1 increases, and the potential of the output terminal OUT also increases. The increase of the potential of the output terminal OUT increases the potential of the node N1. At time t1, the potential of the node N1 becomes larger than the threshold voltage of the NPN transistor Q1. Hence, at time t1, the NPN transistor Q1 is ON. Accordingly, the impedance of the feedback circuit 10 is reduced, and the amplification ratio of the feedback amplifier circuit 1 is reduced. The reduction in the amplification ratio suppresses oscillation of the feedback amplifier circuit 1.

When the direct current component of the input signal IN is reduced and the potential of the output terminal OUT is reduced, the potential of the node N1 becomes lower than the threshold voltage of the NPN transistor Q1 at time t2. Hence, the NPN transistor Q1 is OFF again. Hence, the impedance of the feedback circuit 10 is returned to the state before time t1 again.

As stated above, the feedback amplifier circuit 1 reduces the impedance of the feedback circuit 10 when the direct current component of the input signal increases and the potential of the node N1 becomes larger than the threshold voltage of the NPN transistor Q1. In this way, by reducing the impedance of the feedback circuit 10, the amplification ratio of the feedback amplifier circuit 1 is reduced and oscillation is suppressed. The feedback capacitor C2 suppresses the expansion of the frequency band of the feedback amplifier circuit 1. Accordingly, sufficient phase compensation is performed, and oscillation in the feedback amplifier circuit 1 is effectively prevented.

SUMMARY

As stated above, the feedback amplifier circuit 1 is able to suppress the oscillation. However, only the period in which the feedback amplifier circuit 1 suppresses frequency characteristics is time t1 to t2 when pulses are generated. Thus, the feedback amplifier circuit 1 cannot suppress the frequency characteristics when the pulse is fallen. The gain is not suppressed when the pulse is fallen as shown in FIG. 10, and the ringing is not suppressed.

A first exemplary aspect of the present invention is an amplifier circuit including an amplifier unit that amplifies a signal received by an input terminal and outputs the amplified signal to an output terminal, a feedback capacitor that is connected between the input terminal and the output terminal of the amplifier, and a controller that varies a capacitance in the feedback capacitor for a certain period when a potential of the output terminal in the amplifier unit becomes higher or lower than a certain potential.

The amplifier circuit according to the present invention is able to change the capacity of the feedback capacitor for a predetermined period when the potential of the output terminal of the amplifier unit is higher or lower than a certain potential. Accordingly, the frequency characteristics of the amplifier circuit can be suppressed in this predetermined period.

The amplifier circuit according to the present invention enables to suppress occurrence of the ringing of the output signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

A first exemplary embodiment of the present invention will be described with reference to the drawings. In the first exemplary embodiment, the present invention is applied to a light receiving amplifier.

Figure 1:
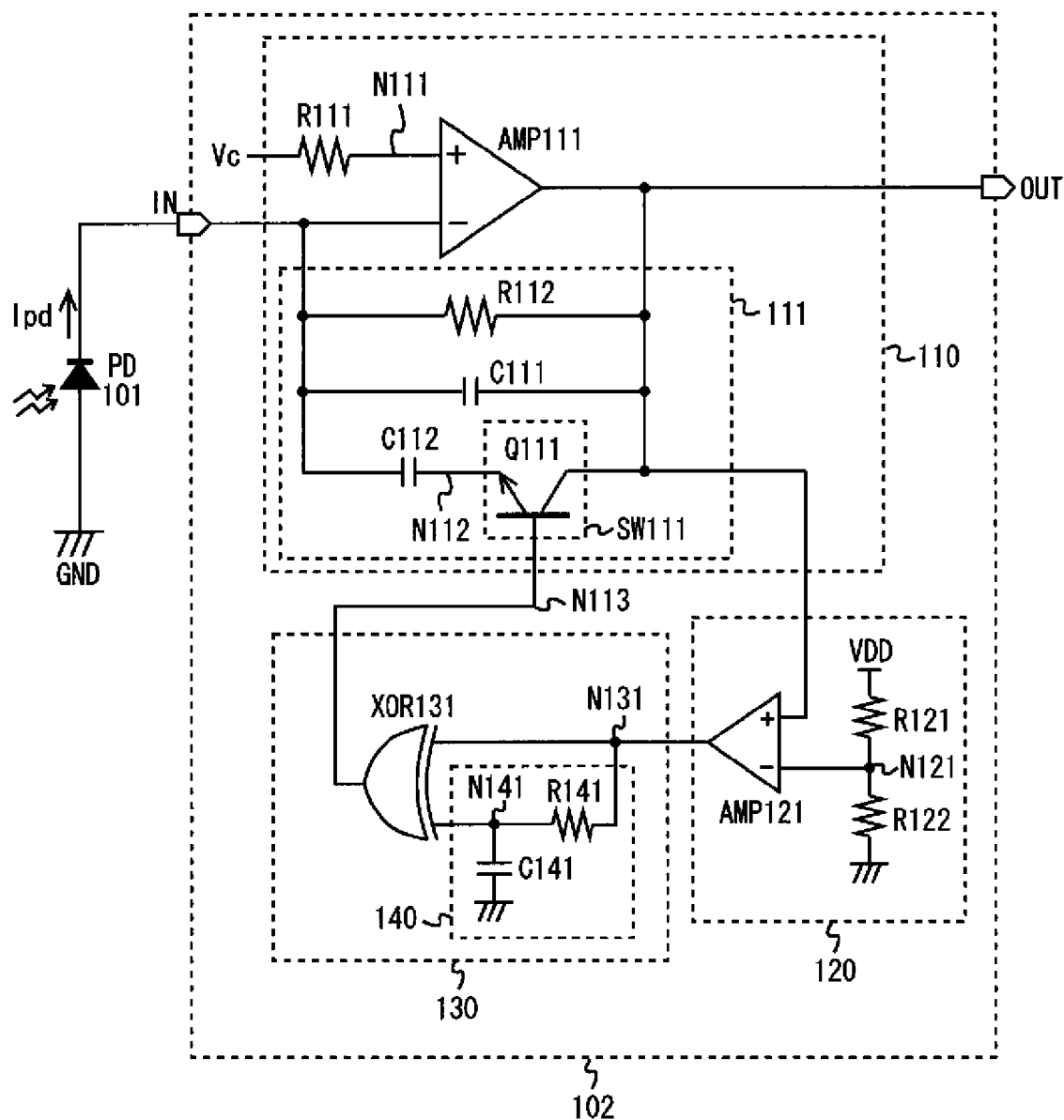
FIG. 1 shows a configuration of a light receiving amplifier according to a first exemplary embodiment.

FIG. 1 shows a configuration of a light receiving amplifier 100 according to the first exemplary embodiment. As shown in FIG. 1, the light receiving amplifier 100 includes a light receiving element PD101, and a feedback amplifier circuit 102. The feedback amplifier circuit 102 includes a differential amplification unit 110, a comparison unit 120, and an edge detector 130.

The light receiving element PD101 is formed of a photoelectric converter such as a photodiode or a phototransistor. Upon receiving a light signal, the light receiving element PD101 outputs a photocurrent Ipd according to the light signal. The light receiving element PD101 is connected between a ground voltage terminal GND and an input terminal IN of the differential amplification unit 110. Although the light receiving element PD101 is arranged outside the differential amplification unit 110 in FIG. 1, it may be arranged inside the differential amplification unit 110.

The differential amplification unit 110 converts the photocurrent Ipd received from the light receiving element PD101 to a voltage. The differential amplification unit 110 includes a differential amplifier AMP111, a feedback capacitor 111, and a resistance element R111. The feedback capacitor 111 includes a resistance element R112, capacitance elements C111 and C112, and a switch SW111. The switch SW111 includes an NPN transistor Q111.

The resistance element R111 has one terminal connected to a node N111, and the other terminal to which a predetermined voltage Vc is supplied.

The differential amplifier AMP111 has a non-inverting input terminal connected to the node N111, an inverting input terminal connected to the input terminal IN, and an output terminal connected to an output terminal OUT. The resistance element R112 has one terminal connected to the input terminal IN, and the other terminal connected to the output terminal OUT. The capacitance element C111 has one terminal connected to the input terminal IN, and the other terminal connected to the output terminal OUT. The capacitance element C112 has one terminal connected to the input terminal IN, and the other terminal connected to a node N112. The NPN transistor Q111 has a collector connected to the output terminal OUT, an emitter connected to the node N112, and a base connected to a node N113.

The resistance element R112 operates as a feedback resistor of the differential amplifier AMP111, and the capacitance elements C111 and C112 operate as feedback capacitors of the differential amplifier AMP111. However, when the NPN transistor Q111 is OFF, only the capacitance element C111 is the feedback capacitor of the differential amplifier AMP111. In contrast, when the NPN transistor Q111 is ON, the capacitance elements C111 and C112 are connected in parallel, and the feedback capacitor of the differential amplifier AMP111 corresponds to the total value of the capacitance elements C111 and C112. The differential amplification unit 110 is able to switch the capacitance value of the feedback capacitor according to the operation state of the NPN transistor Q111.

The comparison unit 120 includes a comparator AMP121, and resistance elements R121 and R122. The resistance element R121 has one terminal connected to a power supply voltage terminal VDD, and the other terminal connected to a node N121. The resistance element R122 has one terminal connected to the node N121, and the other terminal connected to a ground voltage terminal GND. Hence, a certain potential is generated in a node N131 according to the resistance ratio of the resistance elements R121 and R122.

The comparator AMP121 has a non-inverting input terminal connected to the output terminal OUT, an inverting input terminal connected to the node N121, and an output terminal connected to the node N131. The comparator AMP121 outputs a high-level signal to the node N131 when the potential of the output terminal OUT is larger than the certain potential generated in the node N121, and outputs a low-level signal to the node N131 when the potential of the output terminal OUT is smaller than the certain potential.

The edge detector 130 (switch controller) includes an XOR (exclusive OR) circuit XOR131, and a delay circuit 140. The delay circuit 140 includes a resistance element R141 and a capacitance element C141. A resistance element 141 has one terminal connected to the node N131, and the other terminal connected to a node N141. The capacitance element C141 has one terminal connected to the node N141, and the other terminal connected to a ground voltage terminal GND. The XOR circuit XOR131 has one input terminal connected to the node N131, the other input terminal connected to the node N141, and an output terminal connected to the node N113.

The comparison unit 120 and the edge detector 130 constitute a controller that turns on/off the switch SW111.

Figure 2:
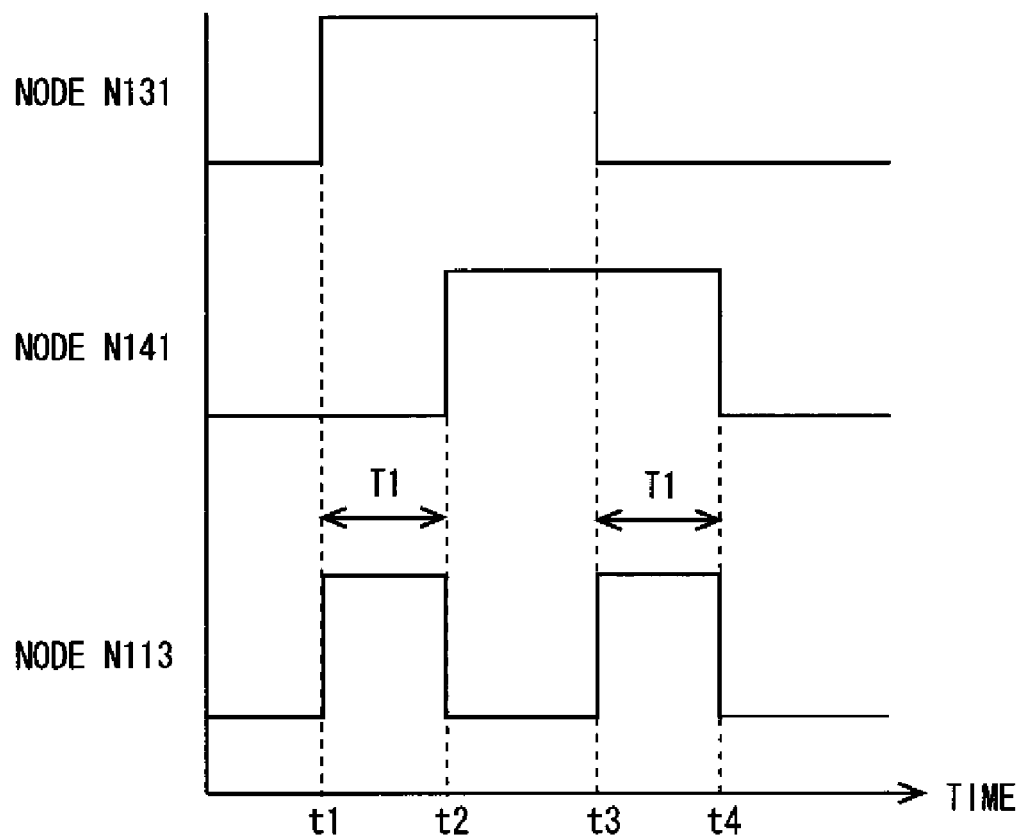
FIG. 2 is a timing chart showing the operation of an edge detector according to the first exemplary embodiment.

FIG. 2 is a timing chart showing the operation of the edge detector 130. At time t1, the high-level signal is output from the comparison unit 120 to the node N131. The delay circuit 140 has a CR time constant of the resistance value of the resistance element R141 and the capacitance value of the capacitance element C141. The certain delay period according to the CR time constant corresponds to T1. Thus, for period T1 from time t1, the signal levels of the nodes N131 and N141 are high and low, respectively. As a result, the high level signal is output from the XOR circuit XOR131 to the node N113. At time t2 when period T1 passes from time t1, the potential level of the node N141 becomes high, and the XOR circuit XOR131 outputs the low level signal to the node N113.

At time t3, the signal output from the comparison unit 120 becomes low. Then, for period T1 from time t3, the signal levels of the nodes N131 and N141 are low and high, respectively. As a result, the XOR circuit XOR131 outputs the high level signal to the node N113. Further, at time t4 when period T1 passes from time t3, the potential level of the node N141 becomes low, and the XOR circuit XOR131 outputs the low level to the node N113.

Figure 3:
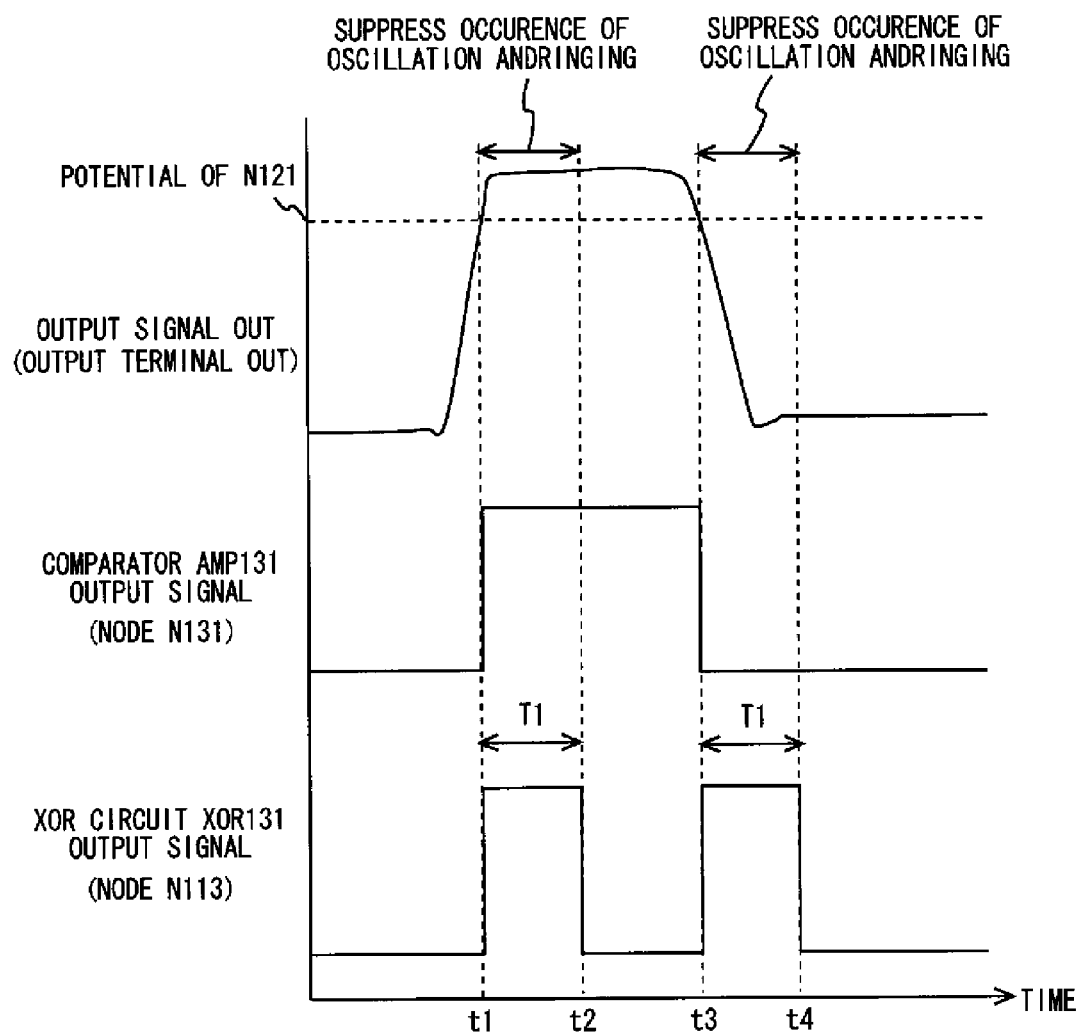
FIG. 3 is a timing chart showing the operation of the light receiving amplifier according to the first exemplary embodiment.

FIG. 3 is a timing chart showing the operation of the light receiving amplifier 100 as stated above. As shown in FIG. 3, the light receiving element PD101 receives the light signal, and the photocurrent Ipd is input to the input terminal IN of the differential amplification unit 110. The output signal OUT having the potential according to the photocurrent Ipd is output to the output terminal OUT. At time t1, the potential of the output signal OUT becomes higher than the potential of the node N121. Thus, the high-level signal is output from the comparator AMP121 to the node N131. Note that, as already described with reference to FIG. 2, the potential of the node N141 is low for delay period T1 from time t1. Thus, the XOR circuit XOR131 outputs the high-level signal to the node N113 for delay period T1 from time t1.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During this period T1, the capacitance value of the feedback capacitor of the differential amplifier AMP111 increases, thereby suppressing the high-frequency component of the input/output signals of the differential amplifier AMP111. This prevents the oscillation of the differential amplification unit 110 and suppresses the ringing.

At time t2 when the delay period T1 passes from time t1, as already described with reference to FIG. 2, the potential of the node N141 becomes high. Then, the XOR circuit XOR131 outputs the low-level signal to the node N113. Hence, the NPN transistor Q111 is OFF. However, at this time, the output signal of the differential amplifier AMP111 is stable in high level; and thus the differential amplification unit 110 does not cause oscillation.

Next, the light receiving element PD101 does not receive the light signal, and the photocurrent Ipd decreases. Thus, the potential of the output signal OUT is reduced. At time t3, the potential of the output signal OUT is lower than the potential of the node N121. Then, the low-level signal is output from the comparator AMP121 to the node N131. However, as already described with reference to FIG. 2, the potential of the node N141 becomes high for period T1 from time t3. Thus, the XOR circuit XOR131 outputs the high-level signal to the node N113 for delay period T1 from time t3.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the period T1, the capacitance value of the feedback capacitor of the differential amplifier AMP111 increases. This enables to suppress the high-frequency component of the input/output signals of the differential amplifier AMP111, to prevent oscillation of the differential amplification unit 110 again, and to suppress the ringing.

Figure 10:
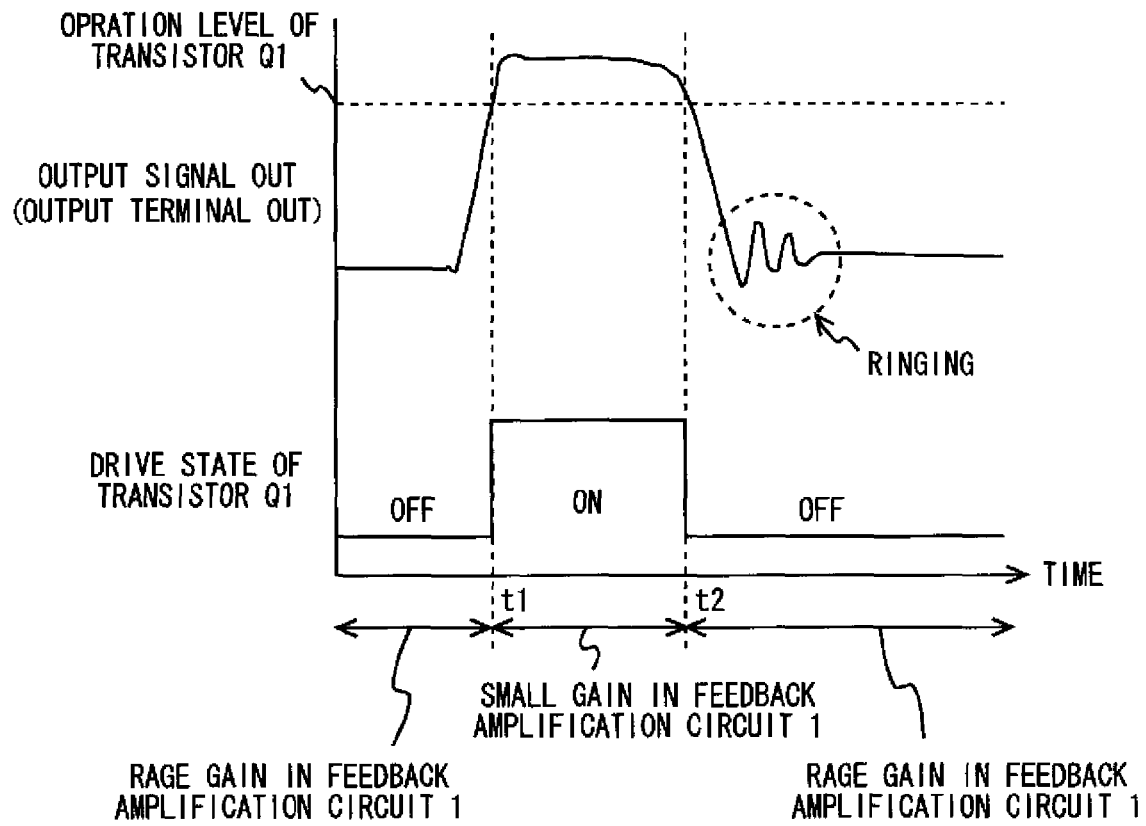
FIG. 10 is a timing chart showing the operation of the feedback amplifier circuit according to the prior art.

In the feedback amplifier circuit 1 of prior art, as already described with reference to FIG. 10, the high-frequency side frequency characteristics can be suppressed only at time t1 to t2 when the pulse is generated. Hence, the frequency characteristics cannot be suppressed after the pulse is fallen, and the ringing cannot be suppressed. Further, the feedback amplifier circuit 1 have different gains before and after the operation of the NPN transistor Q1. Therefore, when the feedback amplifier circuit 1 is used for a light receiving amplifier circuit, the ratio of the light signal intensity received by the light receiving element to the voltage of the output signal OUT is changed, and the accurate light signal intensity cannot be obtained.

However, the feedback amplifier circuit 102 according to the first exemplary embodiment uses the feedback capacitor that is able to suppress the high-frequency component for a certain period after the rising and the falling of the output signal OUT of the differential amplifier AMP111. Accordingly, it is possible to suppress the ringing while preventing the oscillation of the feedback amplifier circuit 102. Further, as only the capacitance value of the feedback capacitor is switched, there is no change in the gain of the differential amplifier AMP111. Therefore, in the light receiving amplifier 100 using the feedback amplifier circuit 102, the ratio of the light signal intensity received by the light receiving element to the voltage of the output signal OUT is not changed before and after the capacitance value of the feedback capacitor is changed. This enables to check the accurate light signal intensities. Second exemplary embodiment A second exemplary embodiment of the present invention will be described in detail with reference to the drawings. In the second exemplary embodiment, as is similar to the first exemplary embodiment, the present invention is applied to a light receiving amplifier.

Figure 4:
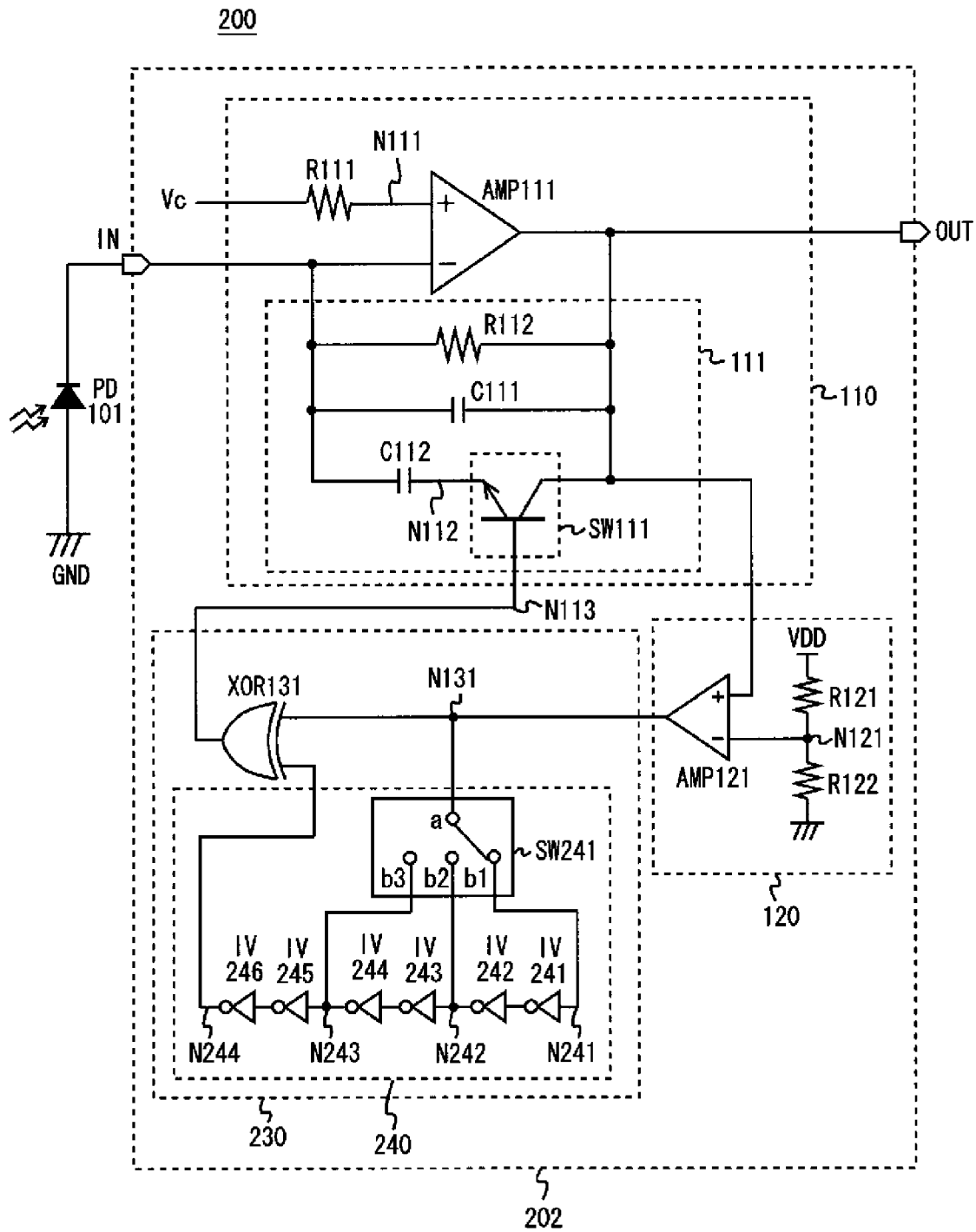
FIG. 4 shows a configuration of a light receiving amplifier according to a second exemplary embodiment.

FIG. 4 shows a configuration of a light receiving amplifier 200 according to the second exemplary embodiment. As shown in FIG. 4, the light receiving amplifier 200 includes a light receiving element PD101, and a feedback amplifier circuit 202. The feedback amplifier circuit 202 includes a differential amplification unit 110, a comparison unit 120, and an edge detector 230. In FIG. 4, the structures identical or similar to those shown in FIG. 1 are denoted by the same reference symbols. The second exemplary embodiment is different from the first exemplary embodiment in the structure of the edge detector 230. In the second exemplary embodiment, the difference from the first exemplary embodiment will mainly be described, and the similar parts as those of the first exemplary embodiment will be omitted. The edge detector 230 includes an XOR circuit XOR131 and a delay circuit 240. The delay circuit 240 includes a switch SW241 and inverters IV241 to IV246.

The switch SW241 includes an input terminal a, and output terminals b1 to b3. The switch SW241 includes an input terminal a connected to a node N131, an output terminal b1 connected to a node N241, an output terminal b2 connected to a node N242, and an output terminal b3 connected to a node N243. The switch SW241 electrically connects the input terminal and one of the output terminals b1 to b3.

The inverters IV241 to IV246 are connected in series between nodes N241 and N244. More specifically, the inverter IV241 has an input terminal connected to the node N241, and an output terminal connected to an input terminal of the inverter IV242. The inverter IV242 has an input terminal connected to the output terminal of the inverter IV241, and an output terminal connected to the node N242. The inverter IV243 has an input terminal connected to the node N242, and an output terminal connected to an input terminal of the inverter IV244. The inverter IV244 has an input terminal connected to the output terminal of the inverter IV243, and an output terminal connected to the node N243. The inverter IV245 has an input terminal connected to the node N243, and an output terminal connected to an input terminal of the inverter IV246. The inverter IV246 has an input terminal connected to the output terminal of the inverter IV245, and an output terminal connected to the node N244.

The XOR circuit XOR131 has one input terminal connected to the node N131, the other input terminal connected to the node N244, and an output terminal connected to the node N113. The other structures are similar to those of the light receiving amplifier 100 according to the first exemplary embodiment.

Figure 5:
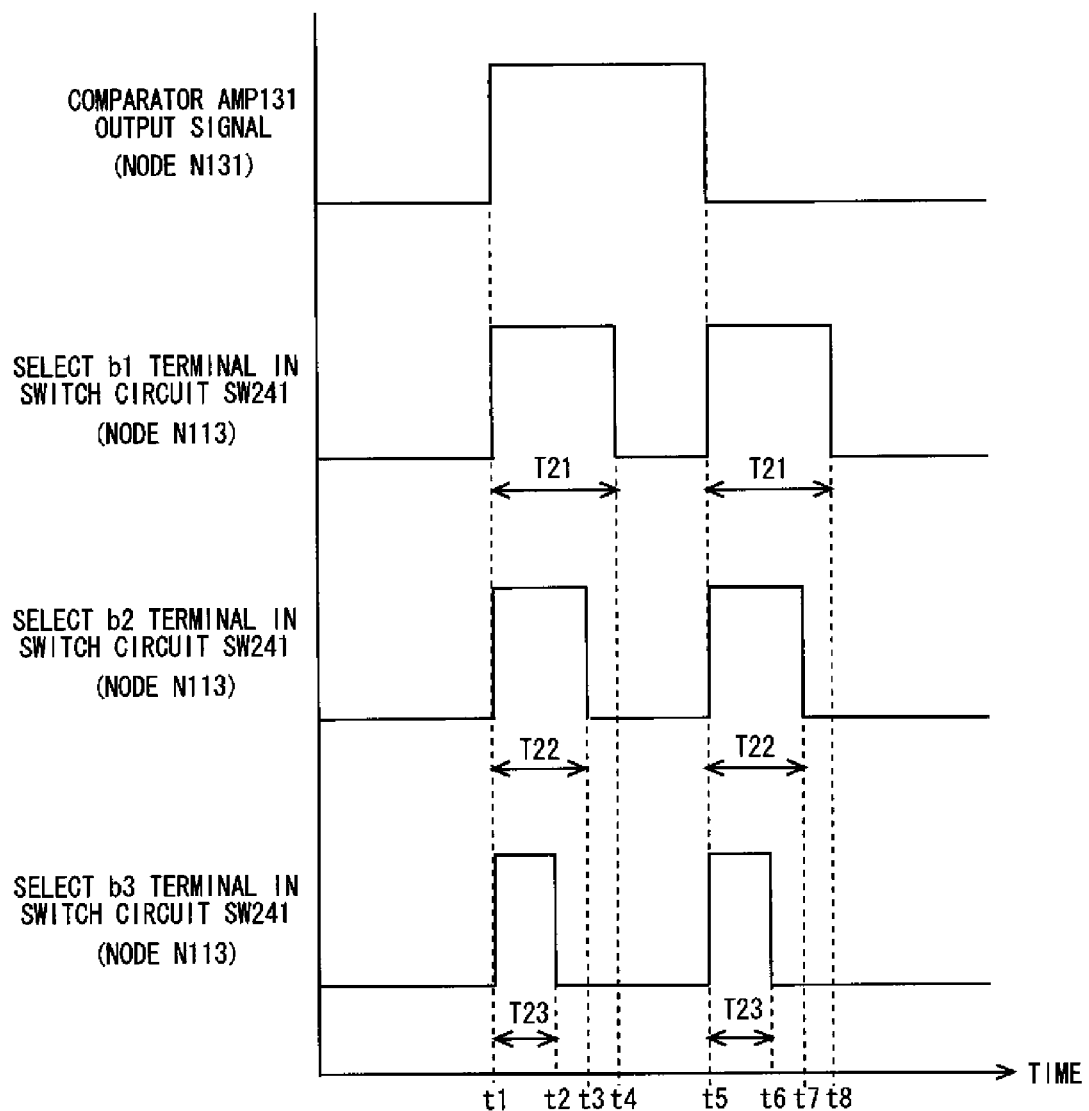
FIG. 5 is a timing chart showing the operation of an edge detector according to the second exemplary embodiment.

FIG. 5 is a timing chart showing the operation of the edge detector 230. A case in which the switch SW241 selects the output terminal b3 will be described. In this case, a signal obtained by delaying the output signal of the comparator AMP121 of the comparison unit 120 by the inverters IV245 and IV246 is output to the node N244. The delay period delayed by the inverters IV245 and IV246 is T23.

At time t1, the high-level signal is output from the comparison unit 120 to the node N131. Thus, for delay period T23 from time t1, the signal levels of the nodes N131 and N244 are high and low, respectively. As a result, the high-level signal is output from the XOR circuit XOR131 to the node N113. At time t2 when the delay period T23 passes from time t1, the potential level of the node N244 becomes high, and the XOR circuit XOR131 outputs the low level signal to the node N113.

At time t5, the signal output from the comparison unit 120 becomes low. Then, the signal levels of the nodes N131 and N244 become low and high, respectively, for delay period T23 from time t5. As a result, the XOR circuit XOR131 outputs the high-level signal to the node N113. At time t6 when the delay period T23 passes from time t5, the potential level of the node N141 becomes low, and the XOR circuit XOR131 outputs the low level signal to the node N113.

Next, a case in which the switch SW241 selects the output terminal b2 will be described. In this case, a signal obtained by delaying the output signal of the comparator AMP121 of the comparison unit 120 by the inverters IV243 to IV246 is output to the node N244. The delay period delayed by the inverters IV243 to IV246 is set to T22 (>T23).

At time t1, the high-level signal is output to the node N131 from the comparison unit 120. Thus, for delay period T22 from time t1, the signal levels of the nodes N131 and N244 are high and low, respectively. As a result, the high-level signal is output from the XOR circuit XOR131 to the node N113. At time t3 when the delay period T22 passes from time t1, the potential level of the node N244 becomes high. Then, the XOR circuit XOR131 outputs the low-level signal to the node N113.

At time t5, the signal output from the comparison unit 120 becomes low. Then, the signal levels of the nodes N131 and N244 are low and high, respectively, for delay period T22 from time t5. As a result, the XOR circuit XOR131 outputs the high level signal to the node N113. Further, the potential level of the node N141 becomes low at time t7 when the delay period T22 passes from time t5, and the XOR circuit XOR131 outputs the low level signal to the node N113.

Further, consider a case in which the switch SW241 selects the output terminal b1. In this case, a signal obtained by delaying the output signal of the comparator AMP121 of the comparison unit 120 by the inverters IV241 to IV246 is output to the node N244. The delay period delayed by the inverters IV241 to IV246 is T21 (>T22).

At time t1, the high-level signal is output from the comparison unit 120 to the node N131. Thus, for delay period T21 from time t1, the signal levels of the nodes N131 and N244 are high and low, respectively. As a result, the high-level signal is output from the XOR circuit XOR131 to the node N113. At time t4 when the delay period T21 passes from time t1, the potential level of the node N244 becomes high, and the XOR circuit XOR131 outputs the low-level signal to the node N113.

At time t5, the signal output from the comparison unit 120 becomes low. Then, for delay period T21 from time t5, the signal levels of the nodes N131 and N244 are low and high, respectively. As a result, the XOR circuit XOR131 outputs the high-level signal to the node N113. At time t8 when the delay period T21 passes from time t5, the potential level of the node N141 becomes low, and the XOR circuit XOR131 outputs the low-level signal to the node N113.

Figure 6:
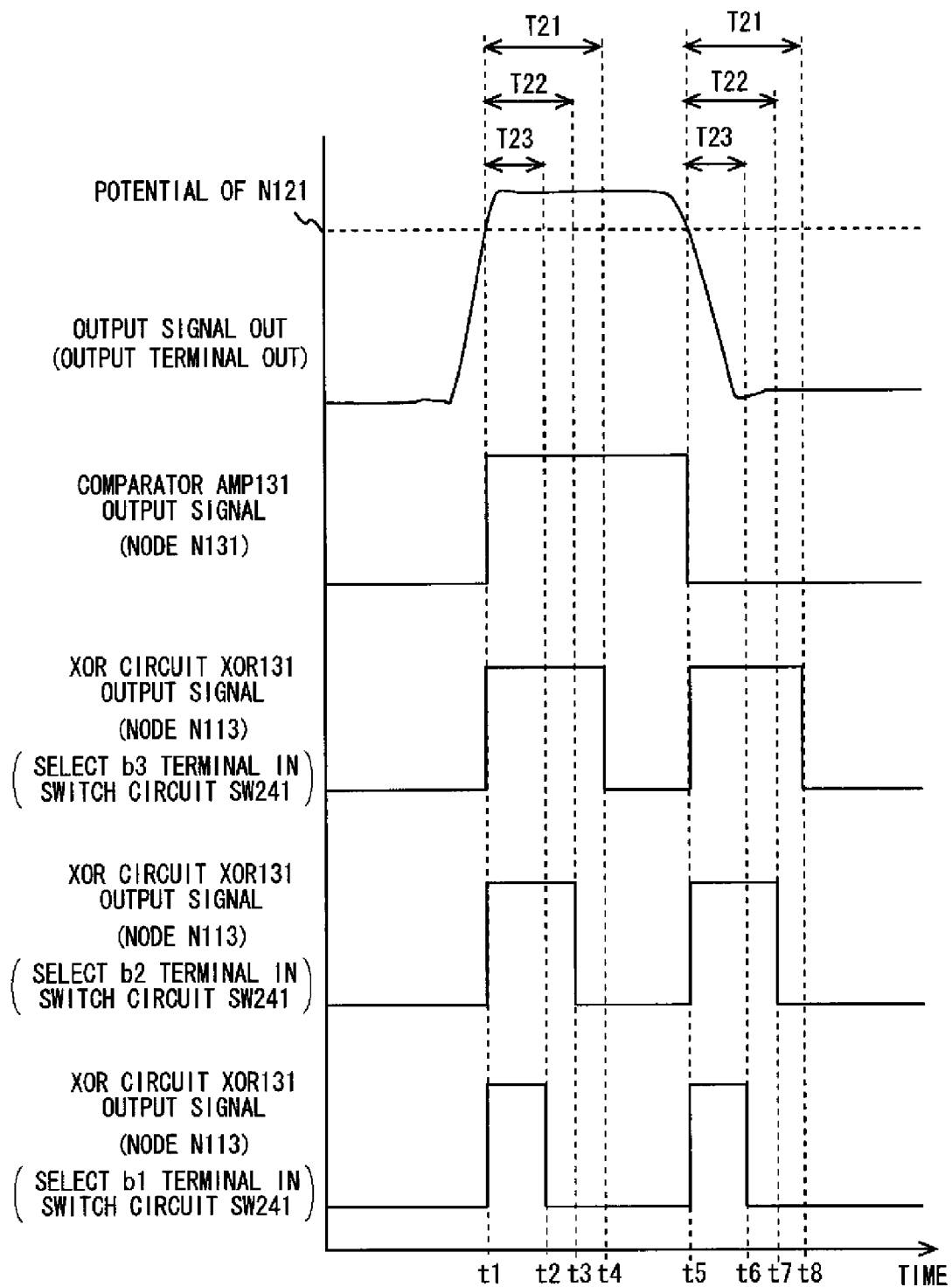
FIG. 6 is a timing chart showing the operation of the light receiving amplifier according to the second exemplary embodiment.

FIG. 6 is a timing chart showing the operation of the light receiving amplifier 200 as described above. FIG. 6 shows the output signals from the XOR circuit XOR131 when the switch SW241 selects one of output terminals b1, b2, and b3. In the following description, a case in which the switch SW241 selects the output terminal b1 (hereinafter referred to as first state), a case in which the switch SW241 selects the output terminal b2 (hereinafter referred to as second state), and a case in which the switch SW241 selects the output terminal b3 (hereinafter referred to as third state) will be described in order.

First, the operation in the third state will be described. As shown in FIG. 6, the light receiving element PD101 receives the light signal, and the photocurrent Ipd is input to the input terminal IN of the differential amplification unit 110. The output signal OUT having the potential according to the photocurrent Ipd is output to the output terminal OUT. At time t1, the potential of the output signal OUT becomes higher than the potential of the node N121. Accordingly, the high-level signal is output from the comparator AMP121 to the node N131. However, as already described with reference to FIG. 5, when the switch SW241 selects the output terminal b3, the potential of the node N244 becomes low for delay period T23 from time t1. Thus, the XOR circuit XOR131 outputs the high-level signal to the node N113 for delay period T23 from time t1.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the delay period T23, the capacitance value of the feedback capacitor of the differential amplifier AMP111 increases. This enables to suppress the high-frequency component of the input/outputs signals of the differential amplifier AMP111, prevent oscillation of the differential amplification unit 110, and suppress the ringing. At time t2 when the delay period T23 passes from time t1, as already described with reference to FIG. 5, the potential of the node N141 becomes high. Then, the XOR circuit XOR131 outputs the low-level signal to the node N113. Thus, the NPN transistor Q111 is OFF. However, in the first state, the output signal of the differential amplifier AMP111 is stable in high level at time t2.

Thus, the differential amplification unit 110 does not cause oscillation.

Next, the light receiving element PD101 does not receive the light signal, and the photocurrent Ipd decreases. Thus, the potential of the output signal OUT is reduced. At time t5, the potential of the output signal OUT becomes lower than the potential of the node N121. Thus, the low-level signal is output from the comparator AMP121 to the node N131. However, as already described with reference to FIG. 5, the potential of the node N244 is high for delay period T23 from time t5. Hence, the XOR circuit XOR131 outputs the high-level signal to the node N113 for delay period T23 from time t5.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During this delay period T23, the capacitance value of the feedback capacitor of the differential amplifier AMP111 increases. This enables to suppress the high-frequency component of the input/output signals of the differential amplifier AMP111, prevent oscillation of the differential amplification unit 110 again, and suppress the ringing.

Next, the operation in the second state will be described. Note that the operation to time t1 is similar to that in the third state. As already described with reference to FIG. 5, when the switch SW241 selects the output terminal b2, the potential of the node N244 becomes low for delay period T22 from time t1. Hence, as shown in FIG. 6, the XOR circuit XOR131 outputs the high-level signal to the node N113 for delay period T22 from time t1.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the delay period T22, the capacitance value of the feedback capacitor of the differential amplifier AMP111 increases. This enables to suppress the high-frequency component of the input/output signals of the differential amplifier AMP111, prevent oscillation of the differential amplification unit 110, and suppress the ringing.

At time t3 when the delay period T22 passes from time t1, as already described with reference to FIG. 5, the potential of the node N141 becomes high. Then, the XOR circuit XOR131 outputs the low-level signal to the node N113. Hence, the NPN transistor Q111 is OFF. However, at time t3, the output signal of the differential amplifier AMP111 is stable in high level in the second state. Accordingly, the differential amplification unit 110 does not cause oscillation.

Next, the light receiving element PD101 does not receive the light signal, and the photocurrent Ipd decreases. Thus, the potential of the output signal OUT is reduced. At time t5, the potential of the output signal OUT becomes lower than the potential of the node N121. Accordingly, the low-level signal is output from the comparator AMP121 to the node N131. However, as already described with reference to FIG. 5, the potential of the node N244 becomes high for delay period T22 from time t5. Hence, the XOR circuit XOR131 outputs the high-level signal to the node N113 for delay period T22 from time t5.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the delay period T22, the capacitance value of the feedback capacitor of the differential amplifier AMP111 increases. This enables to suppress the high-frequency component of the input/output signals of the differential amplifier AMP111, prevent oscillation of the differential amplification unit 110 again, and suppress the ringing.

Further, the operation in the first state will be described. The operation to time t1 is similar to that of the third state. As already described with reference to FIG. 5, when the switch SW241 selects the output terminal b1, the potential of the node N244 becomes low for delay period T21 from time t1. Hence, as shown in FIG. 6, the XOR circuit XOR131 outputs the high-level signal to the node N113 for delay period T21 from time t1.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the delay period T21, the capacitance value of the feedback capacitor of the differential amplifier AMP111 increases. This enables to suppress the high-frequency component of the input/output signals of the differential amplifier AMP111, prevent oscillation of the differential amplification unit 110, and suppress the ringing. At time t4 when the delay period T21 passes from time t1, as already described with reference to FIG. 5, the potential of the node N141 becomes high. Then, the XOR circuit XOR131 outputs the low-level signal to the node N113. Hence, the NPN transistor Q111 is OFF. However, in the first state, the output signal of the differential amplifier AMP111 is stable in the high level at time t3. Hence, the differential amplification unit 110 does not cause oscillation.

Next, the light receiving element PD101 does not receive the light signal, and the photocurrent Ipd decreases. Hence, the potential of the output signal OUT is reduced. At time t5, the potential of the output signal OUT becomes lower than the potential of the node N121. Accordingly, the low-level signal is output from the comparator AMP121 to the node N131.

However, as already described with reference to FIG. 5, the potential of the node N244 becomes high for delay period T21 from time t5. Thus, the XOR circuit XOR131 outputs the high-level signal to the node N113 for delay period T21 from time t5.

The NPN transistor Q111 is ON according to the high-level signal output to the node N113. Then, the other terminal of the capacitance element C112 is electrically connected to the output terminal OUT, and the capacitance value of the feedback capacitor of the differential amplifier AMP111 increases. During the delay period T21, the capacitance value of the feedback capacitor of the differential amplifier AMP111 increases. This enables to suppress the high-frequency component of the input/output signals of the differential amplifier AMP111, prevent oscillation of the differential amplification unit 110 again, and suppress the ringing.

Figure 7:
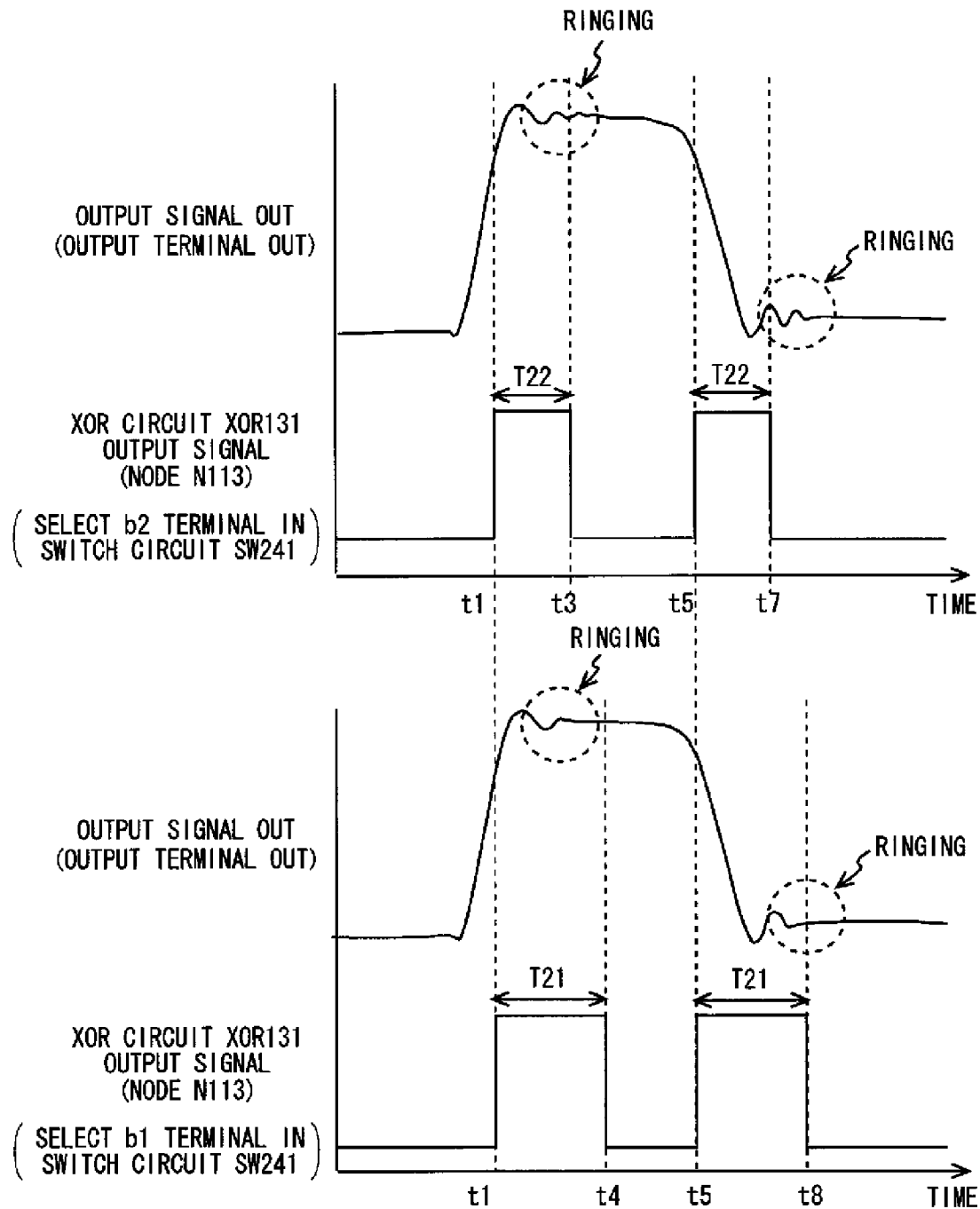
FIG. 7 is a timing chart describing an effect of the light receiving amplifier according to the second exemplary embodiment.

In the first exemplary embodiment, the period in which the output signal of the XOR circuit XOR131 is high is fixed by the CR time constant determined by the resistance element R141 and the capacitance element C141. However, in the second exemplary embodiment, the period in which the output signal of the XOR circuit XOR131 is high can be varied according to the output terminal selected by the switch SW241. Thus, as shown in FIG. 7, the ringing can be promptly suppressed by setting the switch SW241 to the first state if the ringing frequently occurs when the switch SW241 is in the second state.

Note that the present invention is not limited to the above-described exemplary embodiments, but may be changed as appropriate without departing from the spirit of the present invention. For example, the switch SW111 may be formed by MOS transistors, instead of bipolar transistors.

Although the delay circuit 240 is formed of six inverters in the second exemplary embodiment, seven or more inverters may be used to form an inverter chain as long as even number of inverters are used. Further, by connecting the node N131 and the plurality of nodes in the inverter chain by switches, more periods can be set in which the output signal of the XOR circuit XOR131 is high.

Figure 8:
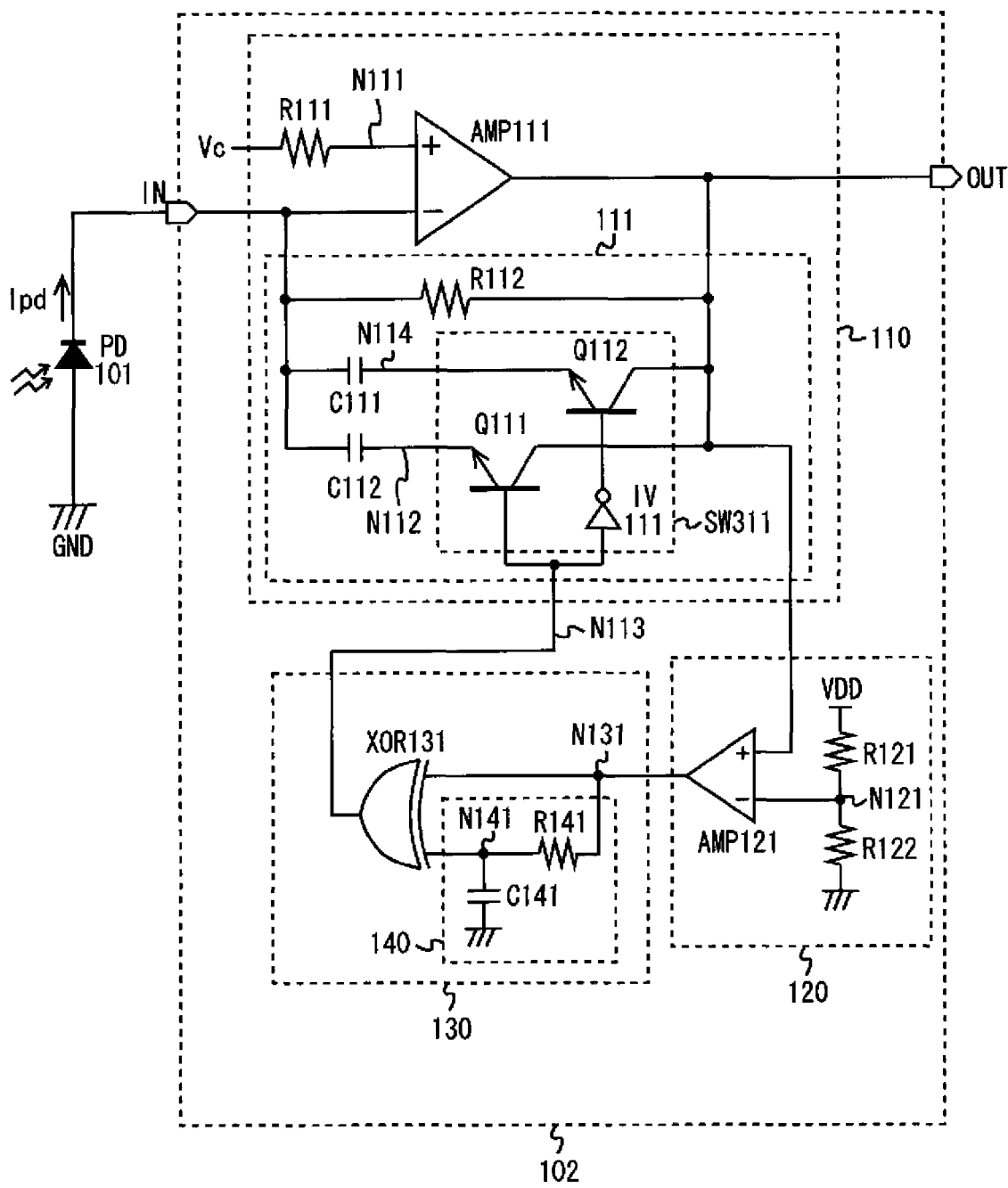
FIG. 8 shows a configuration of a light receiving amplifier according to another exemplary embodiment.
Figure 9:
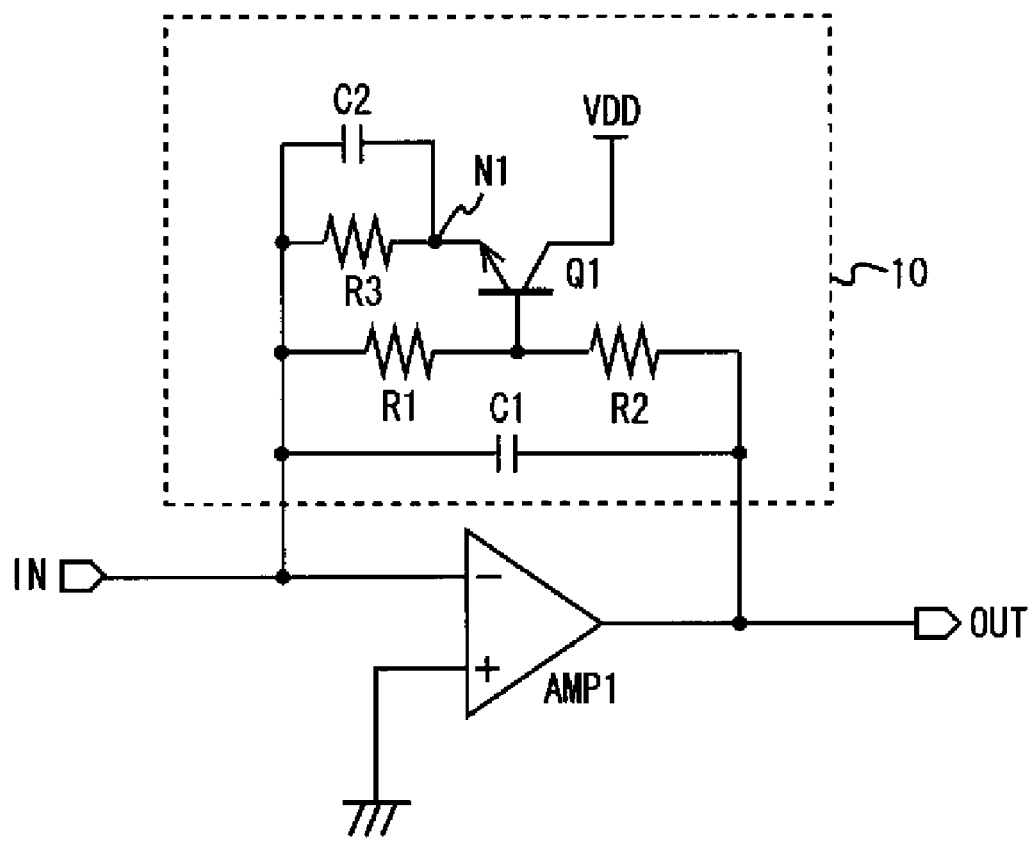
FIG. 9 shows a configuration of a feedback amplifier circuit according to a prior art.

Further, the differential amplification unit 110 may be formed as in a light receiving amplifier 300 shown in FIG. 8. As shown in FIG. 8, the differential amplification unit 110 includes the differential amplifier AMP111, the resistance elements R111 and R112, the capacitance elements C111 and C112, and a switch SW311. The identical or similar structures as those shown in FIG. 1 are denoted by the same reference symbols in FIG. 8.

The switch SW311 includes the NPN transistors Q111 and Q112, and the inverter IV 111. One of the NPN transistors Q111 and Q112 is ON and the other is OFF according to the signal level output from the XOR circuit XOR131 to the node N113. In short, the feedback capacitor of the differential amplifier AMP111 can be varied according to the signal level output from the XOR circuit XOR131 to the node N113. Thus, in the example shown in FIG. 8, the capacitance value of the capacitance element C111 can be made larger than the capacitance value of the capacitance element C112.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first and second exemplary embodiments can be combined as desirable by one of ordinary skill in the art.

What is claimed is:

1. An amplifier circuit comprising:
an amplifier unit that amplifies a signal received by an input terminal and outputs the amplified signal to an output terminal;
a feedback capacitor that is connected between the input terminal and the output terminal of the amplifier; and
a controller that: (1) varies a capacitance in the feedback capacitor for a certain period when a potential of the output terminal in the amplifier unit becomes higher than a certain potential; (2) ceases to vary a capacitance in the feedback capacitor after said certain period has elapsed; and (3) again varies a capacitance in the feedback capacitor for said certain period when a potential of the output terminal in the amplifier unit becomes lower than said certain potential.

2. The amplifier circuit according to claim 1, wherein
the feedback capacitor further comprises first and second capacitance elements, and a first switch,
the first capacitance element is connected between the input terminal and the output terminal of the amplifier unit,
the second capacitance element is connected in parallel with the first capacitance element, and
the first switch electrically connects the second capacitance element with the first capacitance element when the first switch is activated.

3. The amplifier circuit according to claim 2, wherein
the controller comprises a comparison unit and a switch controller,
the comparison unit compares a potential of the output terminal of the amplifier unit with the certain potential, and outputs a comparison result to the switch controller, and
the switch controller activates the first switch for the certain period according to the comparison result in the comparison unit.

4. The amplifier circuit according to claim 3, wherein
the comparison unit comprises a comparator,
the comparator receives the certain potential and a potential of the output terminal of the amplifier unit, and outputs a comparison result from the output terminal as a pulse signal, and
the switch controller comprises an edge detector, and activates the first switch for the certain period upon detection of a rising edge or a falling edge of the pulse signal from the comparator.

5. The amplifier circuit according to claim 4, wherein
the edge detector comprises an exclusive OR operation circuit and a delay circuit,
the delay circuit outputs a delay pulse signal, the delay pulse signal being obtained by delaying the pulse signal from the comparator by the certain period, and
the exclusive OR operation circuit has one input terminal to which the pulse signal from the comparator is input, and another input terminal to which the delay pulse signal is input, so as to activate the first switch according to an operation result.

6. The amplifier circuit according to claim 5, wherein
the delay circuit comprises a third capacitance element and a first resistance element,
the first resistance element is connected between the output terminal of the comparator and another input terminal of the exclusive OR operation circuit, and
the capacitance element is connected between the output terminal of the comparator and a ground voltage terminal.

7. The amplifier circuit according to claim 5, wherein
the delay circuit comprises first and second delay elements, and a second switch,
the first delay element has an output connected to another input terminal of the exclusive OR operation circuit, and outputs an input signal after delaying the input signal by a first period by even number of inverters connected in series,
the second delay element has an output connected to an input of the first delay element, and outputs an input signal after delaying the input signal by a second period by even number of inverters connected in series, and
the second switch is able to switch which of the input of the second delay element and the input of the first delay element is connected to the output terminal of the comparator.

8. A light receiving amplifier circuit comprising the amplifier circuit according to claim 1, wherein a detection signal of a light receiving element is input to the input terminal of the amplifier unit of the amplifier circuit.

9. An amplifier circuit comprising:
an amplifier unit that amplifies a signal received by an input terminal and outputs the amplified signal to an output terminal;
a feedback capacitor that is connected between the input terminal and the output terminal of the amplifier; and
a controller that varies a capacitance in the feedback capacitor for a certain period when a potential of the output terminal in the amplifier unit becomes higher or lower than a certain potential;
wherein the feedback capacitor further comprises first and second capacitance elements, and a first switch,
the first capacitance element is connected between the input terminal and the output terminal of the amplifier unit,
the second capacitance element is connected in parallel with the first capacitance element, and the first switch electrically connects the second capacitance element with the first capacitance element when the first switch is activated;

wherein the controller comprises a comparison unit and a switch controller, the comparison unit compares a potential of the output terminal of the amplifier unit with the certain potential, and outputs a comparison result to the switch controller, and the switch controller activates the first switch for the certain period according to the comparison result in the comparison unit;

wherein the comparison unit comprises a comparator, the comparator receives the certain potential and a potential of the output terminal of the amplifier unit, and outputs a comparison result from the output terminal as a pulse signal, and the switch controller comprises an edge detector, and activates the first switch for the certain period upon detection of a rising edge or a falling edge of the pulse signal from the comparator;

wherein the edge detector comprises an exclusive OR operation circuit and a delay circuit, the delay circuit outputs a delay pulse signal, the delay pulse signal being obtained by delaying the pulse signal from the comparator by the certain period, and the exclusive OR operation circuit has one input terminal to which the pulse signal from the comparator is input, and another input terminal to which the delay pulse signal is input, so as to activate the first switch according to an operation result.

10. The amplifier circuit according to claim 9, wherein the delay circuit comprises a third capacitance element and a first resistance element, the first resistance element is connected between the output terminal of the comparator and another input terminal of the exclusive OR operation circuit, and the capacitance element is connected between the output terminal of the comparator and a ground voltage terminal.

11. The amplifier circuit according to claim 9, wherein the delay circuit comprises first and second delay elements, and a second switch, the first delay element has an output connected to another input terminal of the exclusive OR operation circuit, and outputs an input signal after delaying the input signal by a first period by even number of inverters connected in series, the second delay element has an output connected to an input of the first delay element, and outputs an input signal after delaying the input signal by a second period by even number of inverters connected in series, and the second switch is able to switch which of the input of the second delay element and the input of the first delay element is connected to the output terminal of the comparator.

12. A light receiving amplifier circuit comprising the amplifier circuit according to claim 9, wherein a detection signal of a light receiving element is input to the input terminal of the amplifier unit of the amplifier circuit.

* * * * *